(12) United States Patent
Nguyen

(10) Patent No.: US 9,178,684 B2
(45) Date of Patent: Nov. 3, 2015

(54) SELF-TESTING INTEGRATED CIRCUITS

(71) Applicant: FINISAR CORPORATION, Sunnyvale, CA (US)

(72) Inventor: The' Linh Nguyen, San Jose, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 130 days.

(21) Appl. No.: 14/201,370

(22) Filed: Mar. 7, 2014

(65) Prior Publication Data
US 2014/0254653 A1 Sep. 11, 2014

Related U.S. Application Data

(60) Provisional application No. 61/773,974, filed on Mar. 7, 2013.

(51) Int. Cl.
*H04L 7/00* (2006.01)
*G01R 31/3187* (2006.01)
*G01R 31/317* (2006.01)

(52) U.S. Cl.
CPC .......... *H04L 7/0008* (2013.01); *G01R 31/3187* (2013.01); *G01R 31/31727* (2013.01); *H04L 7/0083* (2013.01)

(58) Field of Classification Search
CPC ..................... G01R 31/31727; G01R 31/3187; H04L 7/0083; H04L 7/0008
See application file for complete search history.

(56) References Cited

U.S. PATENT DOCUMENTS

| | | | |
|---|---|---|---|
| 2002/0087932 A1* | 7/2002 | Ojha ................ | G01R 31/3185 714/739 |
| 2006/0095820 A1* | 5/2006 | Rich .............. | G01R 31/318555 714/733 |
| 2014/0149629 A1* | 5/2014 | Cranford, Jr. ......... | G06F 13/423 710/313 |

FOREIGN PATENT DOCUMENTS

JP 2004-185232 A 7/2004
JP 2004185232 A * 7/2004

OTHER PUBLICATIONS

International Search Report and Written Opinion dated Jun. 16, 2014 as received in PCT Application No. PCT/US2014/022093.

* cited by examiner

*Primary Examiner* — Albert Decady
*Assistant Examiner* — Kyle Vallecillo
(74) *Attorney, Agent, or Firm* — Maschoff Brennan

(57) ABSTRACT

In an example, a self-testing integrated circuit (IC) includes N channels i and a controller, where i is an integer from 1 to N. Each channel i may include a clock and data recovery circuit (CDR), a pseudorandom bit stream (PRBS) generator circuit, and a PRBS checker and eye quality monitor (EQM) circuit. The controller may be configured to selectively couple the channels i in a daisy chain during self-testing.

17 Claims, 3 Drawing Sheets

SELF-TESTING INTEGRATED CIRCUITS

CROSS-REFERENCE TO RELATED APPLICATIONS

This patent application claims the benefit of and priority to U.S. Provisional Patent Application No. 61/773,974, filed Mar. 7, 2013.

FIELD

The embodiments discussed herein are generally related to self-testing integrated circuits.

BACKGROUND

With the increase in internet traffic and demand for high-bandwidth applications such as high-performance computing, data-center connectivity and video content distribution, total aggregate bit rate in integrated circuits (ICs) is increasing both in line rate and number of parallel channels. This drives the need to test ICs at maximum operating rate in order to guarantee high yield in the product. Current Automatic Test Equipment (ATE) is not capable for this type of test both in bandwidth and in number of channels. Without the capability of full-speed test at the ATE level, one will either have to take a yield loss in final assembly, or to attach high-speed add-ons to the ATE or to introduce a second insertion on a test platform that has the full-speed capability. All of the aforementioned solutions add costs to the IC and/or the product in which it is used. Hence there is a need for a low-cost, full-speed self-test.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to self-testing integrated circuits (ICs) that include multiple channels.

In an example embodiment, a method of self-testing an integrated circuit (IC) that includes N channels i, where i is an integer from 1 to N, is described. The method may include selectively coupling the channels i in a daisy chain. The method may also include receiving a reference clock signal at a first CDR included in channel 1. The method may also include verifying, by the first CDR, CDR functionality of the first CDR using the reference clock signal. The method may also include generating, by a first pseudorandom bit stream (PRBS) generator circuit included in channel 1, a PRBS signal_1 using a recovered clock signal recovered by the first CDR. The method may also include outputting, by the first PRBS generator circuit, the PRBS signal_1 to an input of channel 2. The method may also include, for i ranging from 2 to N: verifying, by each channel i, at least some functionality of channel i and at least some functionality of a previous channel i−1 using a PRBS signal_i−1 received from the previous channel i−1 in the daisy chain; generating, by a PRBS generator of each channel i, a PRBS signal_i using a recovered clock recovered from the PRBS signal_i−1; and outputting, by the PRBS generator of each channel i, the PRBS signal_i to the next channel i+1 in the daisy chain.

In another example embodiment, a self-testing integrated circuit (IC) includes N channels i and a controller, where i is an integer from 1 to N. Each channel i may include a clock and data recovery circuit (CDR), a pseudorandom bit stream (PRBS) generator circuit, and a PRBS checker and eye quality monitor (EQM) circuit. The controller may be configured to selectively couple the channels i in a daisy chain during self-testing.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Some embodiments described herein relate to self-testing ICs that include multiple channels. Each channel may include a clock and data recovery circuit (CDR). Accordingly, an example embodiment of the self-testing IC is a multichannel CDR. To accommodate full-speed self-testing, embodiments disclosed herein may further include additional circuits used in the self-testing. For example, to test for locking and error-free operation, each channel may include a pseudorandom bit stream (PRBS) generator and a PRBS checker. For applications that include a referenceless CDR under normal operation, each of the CDRs may have a test mode in which the CDRs can accept a reference clock at a relatively lower speed, such as at ¼, ⅛, 1/16 speed, or the like, and can generate and check PRBS patterns at full rate. To test for output waveform shaping features and input equalization, each CDR may include eye quality monitoring capabilities. Example embodiments of an IC that includes such capabilities and a method of operation thereof are provided in additional detail below.

Some embodiments of multichannel self-testing ICs described herein may be implemented in a variety of operating environments. For instance, multichannel self-testing ICS as described herein may be included in multichannel optoelectronic transceiver and/or transponder modules and/or in other operating environments.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1:
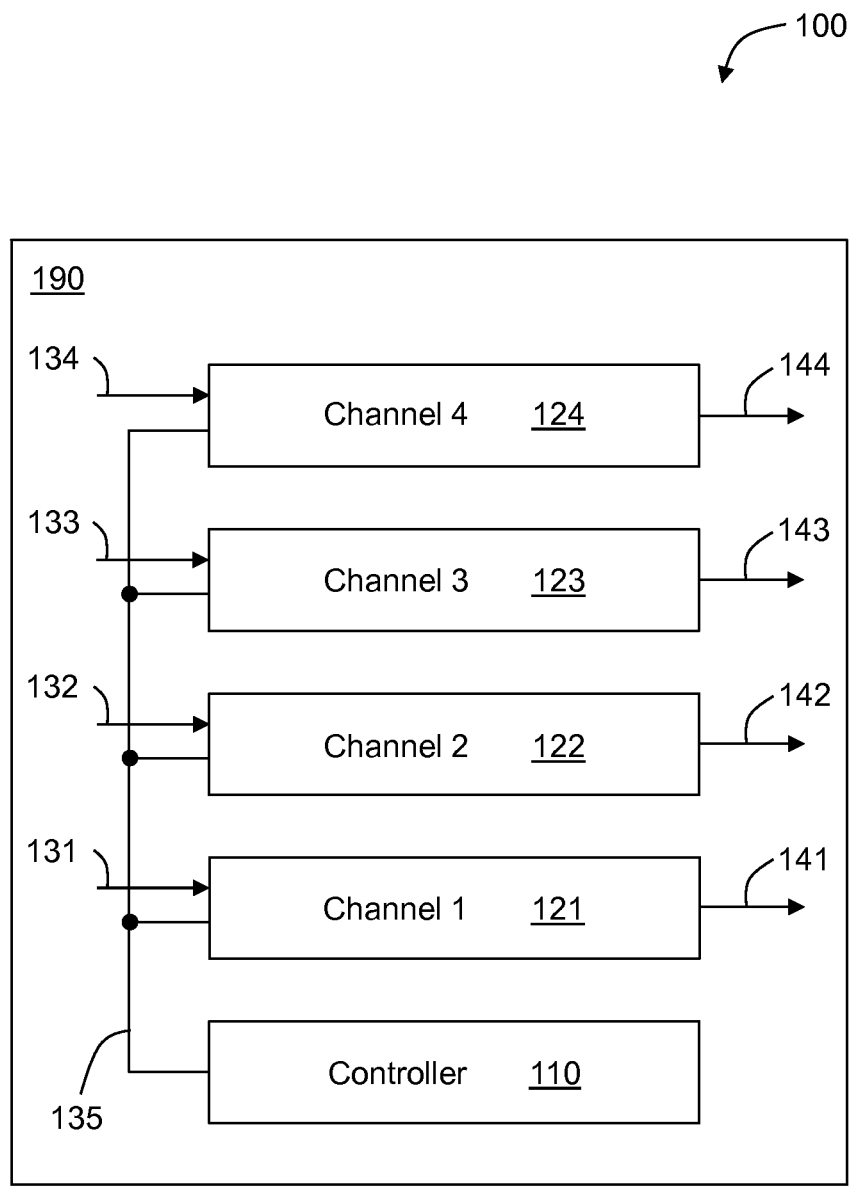
FIG. 1 is a block diagram of an example self-testing IC.

FIG. 1 is a block diagram of an example self-testing IC 100 (hereinafter "IC 100") arranged in accordance with at least some embodiments described herein. The IC 100 includes a controller 110 and multiple channels 121-124. Although four channels 121-124 are illustrated in FIG. 1, the IC 100 may more generally include N channels, where N is an integer greater than 1.

Each of the channels 121-124 may include a CDR. Further, each of the channels 121-124 includes a respective data input lead 131-134 to receive a data signal. Each of the channels 121-124 may additionally include a control lead (not labeled) that communicatively couples each of the channels 121-124 to the controller 110 over a control line 135.

In general, each of the channels 121-124 may be configured to receive a data signal on the corresponding input lead 131-134 and to acquire signal lock and recover data therefrom using any suitable CDR method. The channels 121-124 may output recovered data signals on corresponding output leads 141-144. Alternately or additionally, the channels 121-124 may output a clock signal acquired from the incoming data signals.

The CDR of each of the channels 121-124 may receive a reference clock signal provided on the control line 135 by the controller 110 to perform its functions. Alternately or additionally, the CDR of each of the channels 121-124 may be configured as a referenceless CDR in which the CDR acquires a clock signal from the received data signal, rather than using a separate reference clock signal.

The controller 110 may be configured to control operation of the channels 121-124. For example, the controller 110 may supply a reference clock signal, make settings adjustments, switch between normal operation and self-testing, or the like or any combination thereof. For self-testing, for example, the controller 110 may be configured to selectively couple the channels 121-124 in a daisy chain such that the output lead 141 of channel 1 is communicatively coupled to the input lead 132 of channel 2, the output lead 142 of channel 2 is communicatively coupled to the input lead 133 of channel 3, the output lead 143 of channel 3 is communicatively coupled to the input lead 134 of channel 4, and/or the output lead 144 of channel 4 is communicatively coupled to the input lead 131 of channel 1. With such a daisy chain configuration, each of the channels 121-124 may be able to verify functionality of itself and/or of the previous channel in the daisy chain, as described in greater detail below. As used herein, verifying functionality of a channel or other component may include verifying some, but not necessarily all, of the functionality of the channel or other component. After self-testing is completed, the channels 121-124 may be decoupled from the daisy chain.

Figure 2:
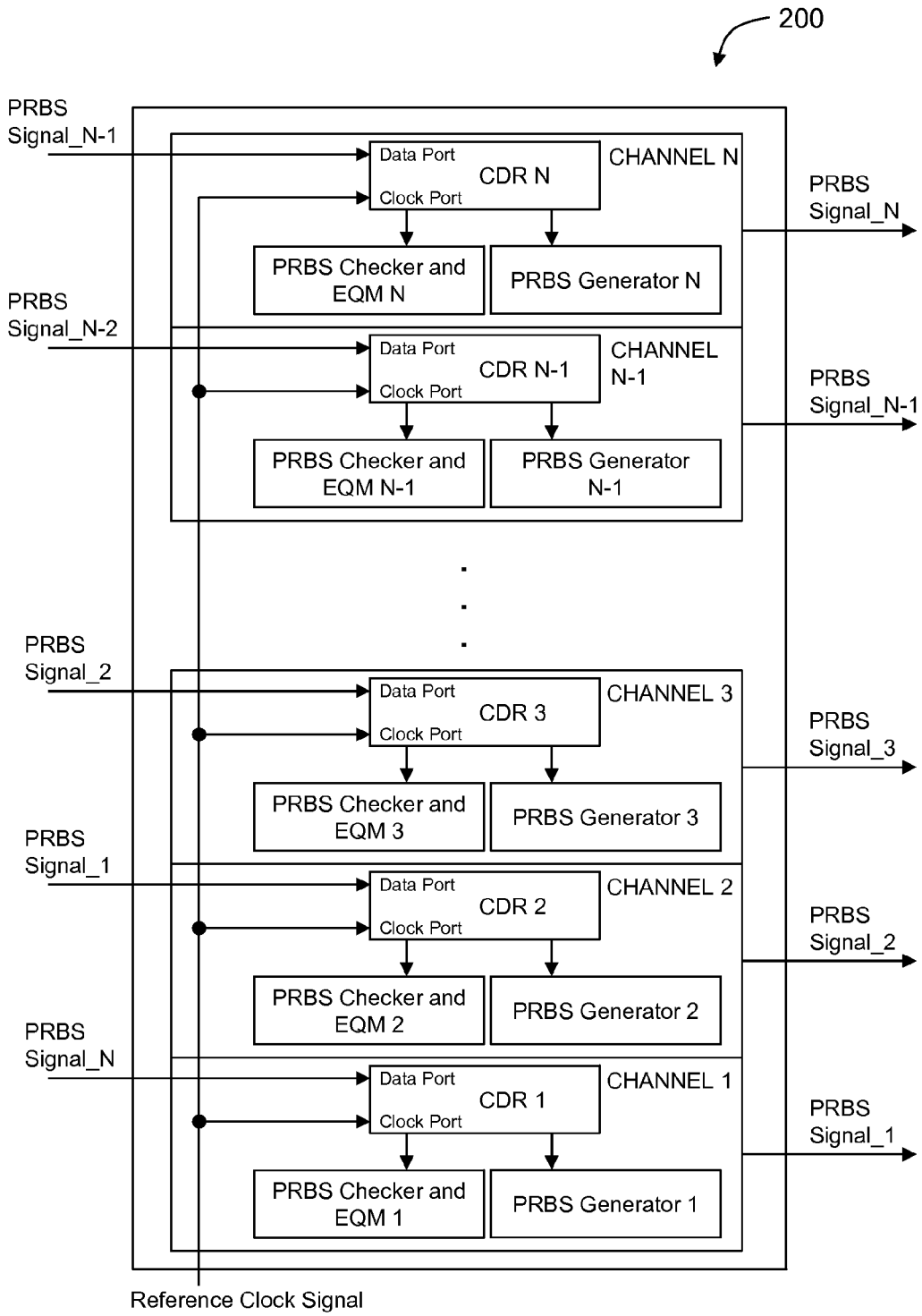
FIG. 2 is a block diagram of an example self-testing IC that may correspond to the IC of FIG. 1.

In this and other embodiments described herein, such as the embodiment of FIG. 2, the entire daisy chain may be maintained, meaning all of the communicative coupling between outputs and inputs may be maintained, the entire time self-testing is performed. Alternately or additionally, only portions of the daisy chain may be maintained as needed during the self-testing, meaning each communicative coupling of the daisy chain may only be maintained for a relatively small window of the self-testing during which an output signal is communicated from the output of one channel to the input of the next channel. Alternately or additionally, some portions of the daisy chain may be maintained the entire time self-testing is performed while other portions of the daisy chain may be maintained only as needed or for less than the entire time self-testing is performed.

As illustrated in FIG. 1, the controller 110 and the channels 121-124 may be formed on a single substrate 190. Forming the controller 110 and the channels 121-124 on the single substrate 190 may include forming physical transistor level components of the controller 110 and the channels 121-124 on the single substrate 190. In some embodiments, the channels 121-124 may each include multiple analog components formed on the single substrate 190. Some of the analog components within each of the channels 121-124 may be formed using bipolar junction transistors (BJTs). Additionally or alternatively, the controller 110 may be formed using complementary metal-oxide semiconductor (CMOS) transistors arranged to produce some form of a processor, such as a microprocessor, that operates based on firmware, software, or some other type of processor instructions stored on a computer readable medium.

Although FIG. 1 illustrates four channels 121-124 formed on the substrate 190 with the controller 110, more or fewer channels may be formed on the substrate 190 with the controller 110 without departing from the scope of this disclosure. For example, two, three, five, six, eight, twelve, sixteen, or some other number of channels may be formed on the substrate 190 with the controller 110.

FIG. 2 is a block diagram of an example self-testing IC 200 (hereinafter "IC 200") that may correspond to the IC 100 of FIG. 1, arranged in accordance with at least some embodiments described herein. The IC 200 includes N channels i, where i is an integer from 1 to N. Thus, as illustrated in FIG. 2, the IC 200 includes channel 1, channel 2, channel 3, ..., channel N−1, and channel N. FIG. 2 further illustrates that each of the channels i includes a CDR, a PRBS generator circuit (hereinafter "PRBS generator"), and a PRBS checker and eye quality monitor (EQM) circuit (hereinafter "PRBS checker and EQM"). The CDRs include CDRs 1 to N that respectively correspond to channels 1 to N. Similarly, the PRBS generators include PRBS generators 1 to N that respectively correspond to channels 1 to N. Similarly, the PRBS Checker and EQMs include PRBS Checker and EQMs 1 to N.

Each of the CDRs includes a data port that corresponds to the data input lead 131, 132, 133, 134 of FIG. 1, as well as a clock port which may correspond to the control lead described with respect to FIG. 1. In the embodiment of FIG. 2, each of the CDRs receives a reference clock signal on a corresponding clock port.

Alternately or additionally, during self-testing as disclosed herein, the PRBS checker and EQM of each channel may perform PRBS checking functions, EQM functions, or both. When performing PRBS checking functions, the PRBS checker and EQM may simply be referred to herein as a PRBS checker. On the other hand, when performing EQM functions, the PRBS checker and EQM may simply be referred to herein as an EQM. Alternately or additionally, the entire name—PRBS checker and EQM—may be used when performing either or both types of functions.

Although not shown in FIG. 2, the IC 200 may further include a controller. Similar to the controller 110 described above with respect to FIG. 1, the controller of the IC 200 may be configured to selectively couple the channels i of the IC 200 in a daisy chain during self-testing and each of the PRBS generators may be configured to output a PRBS signal_i, individually referred to as PRBS signal_1 to PRBS signal_N.

In these and other embodiments, the output of each channel i may be communicatively coupled to an input of a next channel i+1 in the daisy chain for all i from 1 to N−1. Alternately or additionally, the output of channel N may be communicatively coupled to the input of channel 1. Accordingly, and as illustrated in FIG. 2, each PRBS signal_i provided on an output of channel i is received at an input of channel i+1 for all i from 1 to N. In particular, the PRBS signal_1 output by channel 1 is received as input by channel 2, the PRBS signal_2 output by channel 2 is received as input by channel 3, and so on. Additionally, the PRBS signal_N output by channel N is received as input by channel 1.

After self-testing is completed, the channels i of the IC 200 may be decoupled from the daisy chain. As such, after self-testing is completed, each of the channels i may process incoming data on the data port and may output processed data in normal operation.

In general, and during self-testing, each channel i of the IC 200 may be configured to verify functionality of the channel i using one or both of a reference clock signal and a PRBS signal_i−1 received from the previous channel i−1 in the daisy chain. Alternately or additionally, each channel i, for i ranging from 2 to N, 200 may be configured to verify functionality of the previous channel i−1 using one or both of the reference clock signal and the PRBS signal_i−1.

For example, in an example embodiment, channel 1's CDR 1 receives the reference clock signal. A lock indicator of channel 1's CDR 1 verifies the functionality of channel 1's CDR 1 and generates a recovered clock in the process. For example, verifying the functionality of channel 1's CDR 1 may include acquiring a lock on the reference clock signal and/or generating the recovered clock. The recovered clock from channel 1's CDR 1 is used by channel 1's PRBS generator 1 to generate a PRBS pattern at full rate and the PRBS pattern is output from channel 1 as PRBS signal_1. Because the output of channel 1 is communicatively coupled to the input of channel 2 during the self-testing, PRBS signal_1 is received at the input of Channel 2.

A lock indicator of channel 2's CDR 2 and channel 2's PRBS checker 2 (e.g., the portion of PRBS checker and EQM 2 that provides PRBS checker functionality) verifies channel 2's CDR functionality. For example, it may be verified that channel 2's CDR 2 can recover a clock and data from PRBS signal_1. Channel 2 also verifies that Channel 1's PRBS pattern was correctly generated. Channel 2's EQM 2 (e.g., the portion of PRBS checker and EQM 2 that provides EQM functionality) verifies channel 2's equalizer functionality as well as channel 1's output waveform shaping functionality. Channel 2's PRBS generator 2 then generates a PRBS pattern at full rate and outputs it to the input of channel 3 as PRBS signal_2. The process performed by channel 2 is successively repeated in each of channels 3 to N because of the daisy chain, allowing each of channels 2 to N to verify its CDR functionality and equalizer functionality as well as the output waveform shaping functionality of the previous channel in the daisy chain.

As already mentioned, the output of channel N is communicatively coupled to the input of channel 1. At this point all functional and parametric performance has been verified, except for a reference clock mode of channels 2 to N, channel 1's EQM 1 (e.g., the portion of PRBS checker and EQM 1 that provides EQM functionality), channel 1's PRBS checker 1 (e.g., the portion of PRBS checker and EQM 1 that provides PRBS checker functionality), Channel N's PRBS generator N, and channel N's waveform shaping functionality. Accordingly, channels 2 to N may be programmed to accept the reference clock signal so that Channel 1 is now programmed to accept data instead of the reference clock signal. Channel 1's PRBS checker and EQM 1 can be used to verify channel 1's equalizer functionality, channel N's PRBS generator N, and channel N's waveform shaping functionality.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 3:
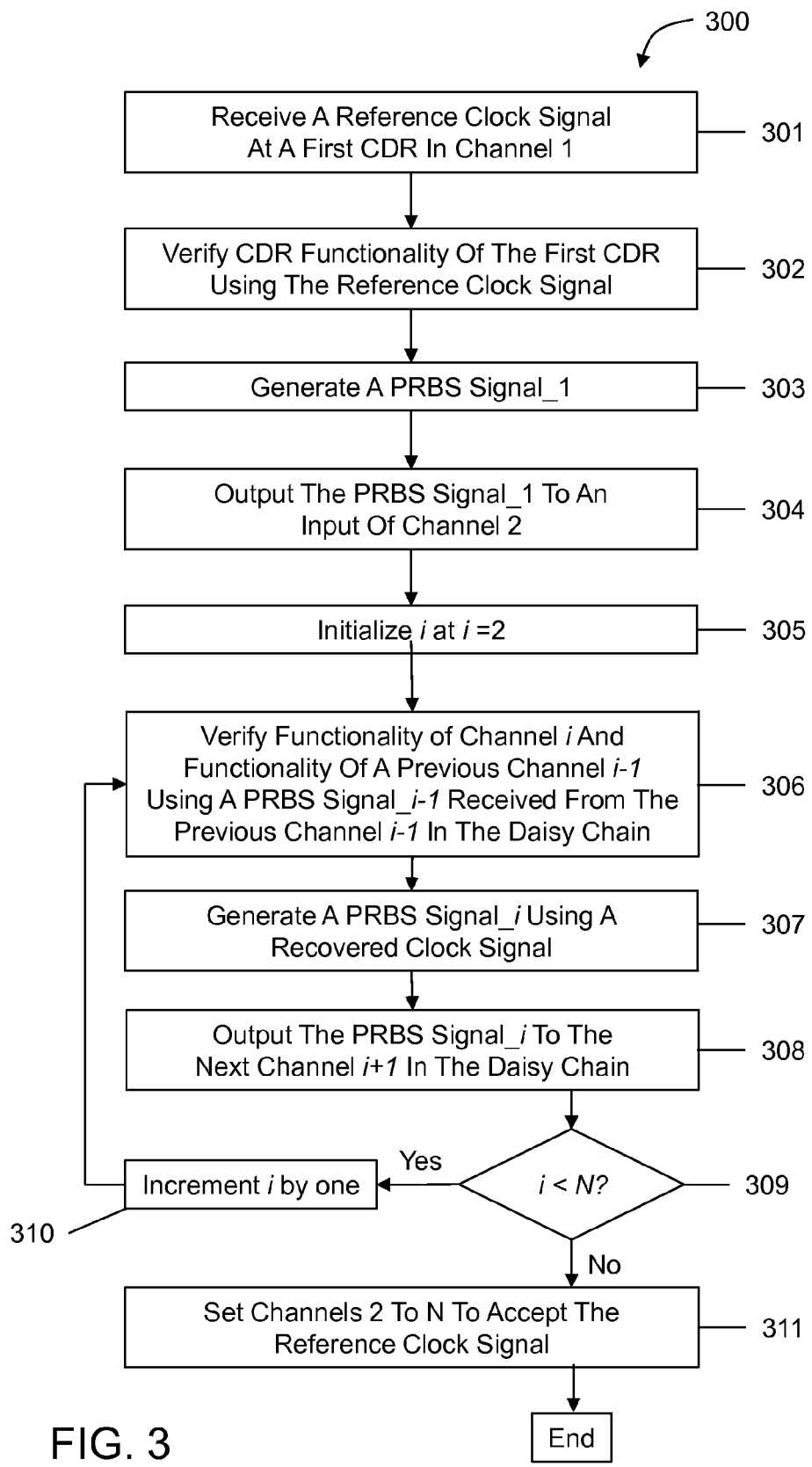
FIG. 3 is a flowchart of an example method of self-testing an IC, all arranged in accordance with at least some embodiments described herein.

FIG. 3 is a flowchart of an example method 300 of self-testing an IC, arranged in accordance with at least some embodiments described herein. The method 300 may generally correspond to the method described above in the context of FIG. 2. The method 300 in some embodiments is performed by an IC, such as the IC 100 or the IC 200. An IC with suitable components such as those described herein may be configured to perform the method 300 by providing the IC with suitable hardware, software, and/or firmware. For simplicity in the discussion that follows, the method 300 will be discussed as being performed by the IC 200. Although illustrated as discrete blocks, various blocks may be divided into additional blocks, combined into fewer blocks, or eliminated, depending on the desired implementation The method 300 may begin at block 301 in which a reference clock signal is received at the CDR 1 in channel 1 (referred to hereinafter as "first CDR").

At block 302, the first CDR verifies functionality of the first CDR using the reference clock signal. The first CDR verifying functionality of the first CDR using the reference clock signal may include acquiring a lock on the reference clock signal and/or generating a recovered clock signal.

At block 303, the PRBS generator 1 of channel 1 (referred to hereinafter as "first PRBS generator") generates PRBS signal_1. PRBS signal_1 may be generated using the recovered clock signal.

At block 304, PRBS signal_1 is output by channel 1 to the input of channel 2.

From blocks 305-310, each channel i, for i ranging from 2 to N, is configured to verify functionality of channel i and functionality of a previous channel i−1 using a PRBS signal_i−1 received from the previous channel i−1 in the daisy chain at block 306, is configured to generate a PRBS signal_i using a recovered clock signal recovered from the PRBS signal_i−1, and is configured to output the PRBS signal_i to the next channel i+1 in the daisy chain.

More particularly, at block 305, i is initialized at i=2.

At block 306, channel 2 verifies functionality of channel 2 and functionality of channel 1 using PRBS signal_1 received from channel 1. Verifying functionality of channel 2 and functionality of channel 1 using PRBS signal_1 may include at least one of: operating the CDR 2 of channel 2 in a referenceless clock mode to acquire a clock from the PRBS signal_1 to verify CDR functionality including referenceless clock acquisition for channel 2; the CDR 2 of channel 2 recovering data from the PRBS signal_1 and the PRBS checker 2 of channel 2 comparing the PRBS signal_2 against the recovered data to verify CDR functionality including data recovery for channel 2; the EQM 2 of channel 2 verifying equalizer functionality for channel 2; and the EQM 2 of channel 2 verifying waveform shaping functionality for channel 1.

More generally, at block 306, channel i verifies a functionality of channel i and functionality of a previous channel i−1 using a PRBS signal_i−1 received from the previous channel in the daisy chain. For example, verifying the functionality of channel i and functionality of a previous channel i−1 using a PRBS signal_i−1 received from the previous channel in the daisy chain may include at least one of: the CDR i of channel i operating in a referenceless clock mode to acquire a clock from the PRBS signal_i−1 to verify CDR functionality including referenceless clock acquisition for channel i; the CDR i of channel i recovering data from the PRBS signal_i−1 and the PRBS checker i (e.g., the portion of the PRBS checker and EQM i that provides PRBS checker functionality) of channel i comparing the PRBS signal_i against the recovered data to verify CDR functionality including data recovery for channel i; the EQM i (e.g., the portion of the PRBS checker and EQM i that provides EQM functionality) of channel i verifying equalizer functionality for channel i; and the EQM i of channel i verifying waveform shaping functionality for channel i−1.

In some examples, as already mentioned, the CDR i of channel i may operate in a referenceless clock mode to acquire a clock from the PRBS signal_i−1 to verify CDR functionality including referenceless clock acquisition for channel i. If the CDR i fails to acquire the clock from the PRBS signal i−1, the CDR i may determine that the CDR functionality including referenceless clock acquisition is not functioning properly. Alternately or additionally, if the CDR i successfully acquires the clock from the PRBS signal i−1, the CDR i may determine that the CDR functionality including referenceless clock acquisition is functioning properly.

In some examples, as already mentioned, the PRBS checker i of channel i may compare the PRBS signal_i against the recovered data to verify CDR functionality including data recovery for channel i. If the PRBS signal_i does not match the recovered data, the PRBS checker i of channel i may determine that the CDR functionality including data recovery for channel i is not functioning properly. Alternately or additionally, if the PRBS signal_i matches the recovered data, the PRBS checker i of channel i may determine that the CDR functionality including data recovery for channel i is functioning properly.

Returning to FIG. 3, at block 307, the PRBS generator 2 of channel 2 generates PRBS signal_2 using a recovered clock recovered from the PRBS signal_1. More generally, at block 307, the PRBS generator i of channel i generates PRBS signal_i using a recovered clock recovered from the PRBS signal_i−1.

At block 308, the PRBS generator 2 of channel 2 outputs PRBS signal_2 to the next channel 3 in the daisy chain. More generally, at block 308, the PRBS generator i of channel i outputs PRBS signal_i to the next channel i+1 in the daisy chain.

At block 309, it is determined whether i is currently less than N. If i is not less than N ("No" at block 309), e.g., if i is already equal to N, the method 300 proceeds to block 311. If i is less than N ("Yes" at block 309), the method proceeds to block 310.

At block 310, i is incremented by 1. For example, i may be incremented from 2 to 3. From block 310, the method returns to block 306 and repeats until i is no longer less than N.

At block 311, channels 2 to N are set to accept the reference clock signal to verify channel N's PRBS generator N and waveform shaping and to verify channel 1's PRBS checker 1, equalizer, and EQM 1.

Optionally, the method 300 may further include, for i ranging from 2 to N, receiving the reference clock signal at the CDR i in channel i. The CDR of channel i may then verify CDR functionality of the CDR i of channel i using the reference clock signal, including the CDR i of channel i acquiring a lock on the reference clock signal.

Alternately or additionally, the method 300 may further include channel 1 verifying functionality of channel 1 and functionality of channel N using PRBS signal_N received from channel N. The foregoing may include at least one of: the first CDR operating in a referenceless clock mode to acquire a clock from the PRBS signal_N to verify CDR functionality including referenceless clock acquisition for channel 1; the first CDR recovering data from the PRBS signal_N and the PRBS checker 1 of channel 1 comparing the PRBS signal_1 against the recovered data to verify CDR functionality including data recovery for channel 1; the EQM 1 of channel 1 verifying equalizer functionality for channel 1; and the EQM 1 of channel 1 verifying waveform shaping functionality for channel N.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of self-testing an integrated circuit (IC) that includes N channels i, where i is an integer from 1 to N, the method comprising:
   selectively coupling the channels i in a daisy chain;
   receiving a reference clock signal at a first clock and data recovery circuit (CDR) included in channel 1;
   verifying, by the first CDR, CDR functionality of the first CDR using the reference clock signal;
   generating, by a first pseudorandom bit stream (PRBS) generator circuit included in channel 1, a PRBS signal_1 using a recovered clock signal recovered by the first CDR;
   outputting, by the first PRBS generator circuit, the PRBS signal_1 to an input of channel 2; and
   for i ranging from 2 to N:
      verifying, by each channel i, at least some functionality of channel i and at least some functionality of a previous channel i−1 using a PRBS signal_i−1 received from the previous channel i−1 in the daisy chain;
      generating, by a PRBS generator of each channel i, a PRBS signal_i using a recovered clock recovered from the PRBS signal_i−1; and
      outputting, by the PRBS generator of each channel i, the PRBS signal_i to the next channel i+1 in the daisy chain.

2. The method of claim 1, wherein selectively coupling the channels i in the daisy chain comprises selectively coupling the channels i such that, for all i from 1 to N−1, an output of each channel i is communicatively coupled to an input of a next channel i+1.

3. The method of claim 2, wherein selectively coupling the channels i in the daisy chain further comprises selectively coupling the channels i such that an output of channel N is coupled to an input of channel 1.

4. The method of claim 1, wherein the first CDR verifying CDR functionality of the first CDR using the reference clock signal comprises the first CDR acquiring a lock on the reference clock signal.

5. The method of claim 1, wherein each channel i verifying at least some functionality of channel i and at least some functionality of the previous channel i−1 using the PRBS signal_i−1 received from the previous channel i−1 in the daisy chain comprises a CDR of channel i operating in a referenceless clock mode to acquire a clock from the PRBS signal_i−1 to verify CDR functionality that includes referenceless clock acquisition for channel i.

6. The method of claim 1, wherein each channel i verifying at least some functionality of channel i and at least some functionality of the previous channel i−1 using the PRBS signal_i−1 received from the previous channel i−1 in the daisy chain comprises a CDR of channel i recovering data from the PRBS signal_i−1 and a PRBS checker and eye quality monitor (EQM) circuit of channel i comparing the PRBS signal_i against the recovered data to verify CDR functionality that includes data recovery for channel i.

7. The method of claim 1, wherein each channel i verifying at least some functionality of channel i and at least some functionality of the previous channel i−1 using the PRBS signal_i−1 received from the previous channel i−1 in the daisy chain comprises a PRBS checker and eye quality monitor (EQM) circuit of channel i verifying equalizer functionality for channel i.

8. The method of claim 1, wherein each channel i verifying at least some functionality of channel i and at least some functionality of the previous channel i−1 using the PRBS signal_i−1 received from the previous channel i−1 in the daisy chain comprises a PRBS checker and eye quality monitor (EQM) circuit of channel i verifying waveform shaping functionality for channel i−1.

9. The method of claim 1, further comprising, for i ranging from 2 to N:
receiving the reference clock signal at a CDR in channel i; and
the CDR of channel i verifying CDR functionality of the CDR of channel i using the reference clock signal, including the CDR of channel i acquiring a lock on the reference clock signal.

10. The method of claim 8, wherein the channels i are selectively coupled in the daisy chain during self-testing such that an output of channel N is communicatively coupled to the input of channel 1, the method further comprising channel 1 verifying functionality of channel 1 and functionality of channel N using a PRBS signal_N received from channel N, including at least one of:
the first CDR operating in a referenceless clock mode to acquire a clock from the PRBS signal_N to verify CDR functionality including referenceless clock acquisition for channel 1;
the first CDR recovering data from the PRBS signal_N and a PRBS checker and EQM circuit of channel 1 comparing the PRBS signal_1 against the recovered data to verify CDR functionality including data recovery for channel 1;
the PRBS checker and EQM circuit of channel 1 verifying equalizer functionality for channel 1; and
the PRBS checker and EQM circuit of channel 1 verifying waveform shaping functionality for channel N.

11. A self-testing integrated circuit (IC) comprising:
N channels i, where i is an integer from 1 to N, wherein each channel i comprises:
a clock and data recovery circuit (CDR);
a pseudorandom bit stream (PRBS) generator circuit; and
a PRBS checker and eye quality monitor (EQM) circuit; and
a controller configured to selectively couple the channels i in a daisy chain during self-testing.

12. The self-testing IC of claim 11, wherein the channels i are selectively coupled in the daisy chain during self-testing such that an output of each channel i is communicatively coupled to an input of a next channel i+1 in the daisy chain for all i from 1 to N−1.

13. The self-testing IC of claim 12, wherein the channels i are further selectively coupled during self-testing such that an output of channel N is communicatively coupled to the input of channel 1.

14. The self-testing IC of claim 11, wherein during self-testing, for i ranging from 2 to N:
each channel i is configured to verify at least some functionality of channel i using a PRBS signal_i−1 received from a previous channel i−1 in the daisy chain; and
each channel i is configured to verify at least some functionality of the previous channel i−1 using the PRBS signal_i−1.

15. The self-testing IC of claim 11, wherein for each channel i, the CDR includes a data port and a clock port.

16. The self-testing IC of claim 11, wherein for each channel i, an input of the PRBS generator circuit is coupled to an output of the CDR.

17. The self-testing IC of claim 11, wherein for each channel i, an input of the PRBS checker and EQM circuit is coupled to an output of the CDR.

\* \* \* \* \*